(12) United States Patent
Joye

(10) Patent No.: US 9,777,384 B2
(45) Date of Patent: Oct. 3, 2017

(54) MICROFABRICATION OF TUNNELS

(75) Inventor: Colin D. Joye, Alexandria, VA (US)

(73) Assignee: The United States of America, as represented by the Secretary of the Navy, Washington, DC (US)

(*) Notice: Subject to any disclaimer, the term of this patent is extended or adjusted under 35 U.S.C. 154(b) by 279 days.

(21) Appl. No.: 13/420,696

(22) Filed: Mar. 15, 2012

(65) Prior Publication Data
US 2012/0255863 A1    Oct. 11, 2012

Related U.S. Application Data

(60) Provisional application No. 61/471,828, filed on Apr. 5, 2011.

(51) Int. Cl.
   *C25D 1/02*        (2006.01)
   *C25D 1/00*        (2006.01)
   *G03F 7/00*        (2006.01)

(52) U.S. Cl.
   CPC ............ *C25D 1/003* (2013.01); *C25D 1/02* (2013.01); *G03F 7/00* (2013.01)

(58) Field of Classification Search
   USPC .......................................... 205/70, 73, 118
   See application file for complete search history.

(56) References Cited

U.S. PATENT DOCUMENTS

| | | | |
|---|---|---|---|
| 4,826,284 A * | 5/1989 | Sakagami | D01F 8/04 385/123 |
| 6,602,448 B1 * | 8/2003 | Ilyashenko | B29D 11/00682 264/1.24 |
| 6,696,305 B2 | 2/2004 | Kung et al. | |
| 6,847,036 B1 * | 1/2005 | Darling et al. | 250/291 |
| 6,919,046 B2 * | 7/2005 | O'Connor et al. | 422/502 |
| 7,204,139 B2 | 4/2007 | Takayama | |
| 7,323,143 B2 | 1/2008 | Anderson et al. | |
| 7,745,077 B2 | 6/2010 | Thiyagarajan et al. | |
| 8,110,898 B2 | 2/2012 | Lewis et al. | |
| 2006/0057504 A1 * | 3/2006 | Sadwick et al. | 430/320 |

(Continued)

FOREIGN PATENT DOCUMENTS

| | | |
|---|---|---|
| EP | WO 2005/054547 | 6/2005 |
| JP | 2008240142 | 10/2008 |

OTHER PUBLICATIONS

Chomnawang, N., et al., "On-chip 3D air core micro-inductor for high-frequency applications using deformation of sacrificial polymer". Smart Structure and Materials, 2001, SPIE.*

(Continued)

*Primary Examiner* — Stefanie S Wittenberg
(74) *Attorney, Agent, or Firm* — US Naval Research Laboratory; William P. Ladd

(57) ABSTRACT

A system and method to form beam tunnels in interaction circuits. Forms, such as fibers or sheets can be located and secured above a substrate at a desired size and desired shape to form the final shape of the beam tunnels. Fiber holders can be utilized to position the forms above the substrate. A photoresist can then be applied over the substrate embedding the forms. A single exposure LIGA process can be performed on the photoresist, including the steps of ultraviolet photolithography, molding, and electroforming. After the process, the forms can be removed to leave the beam tunnels in the interaction circuits.

20 Claims, 4 Drawing Sheets

(56) References Cited

U.S. PATENT DOCUMENTS

| | | | |
|---|---|---|---|
| 2006/0057505 A1 | 3/2006 | Sadwick et al. | |
| 2006/0084942 A1* | 4/2006 | Kim et al. | 604/890.1 |
| 2009/0057839 A1* | 3/2009 | Lewis et al. | 257/618 |
| 2010/0068740 A1* | 3/2010 | Kaplan | B01L 3/502707 435/14 |

OTHER PUBLICATIONS

Metz, S., et al., "Polyimide and SU-8 microfluidic devices manufactured by heat-depolymerizable sacrificial material technique", Miniaturisation for chemistry, biology & bioengineering, Lab Chip, 2004, 4, 114-120.*
Qiu, J.X.; Levush, B.; Pasour, J.; Katz, A.; Armstrong, C.M.; Whaley, D.R.; Tucek, J.; Kreischer, K.; Gallagher, D.; , "Vacuum tube amplifiers," Microwave Magazine, IEEE , vol. 10, No. 7, pp. 38-51, Dec. 2009.
Nguyen, K.; Pasour, J.; Wright, E.; Abe, D.; Ludeking, L.; Pershing, D.; Levush, B.; , "Linearity performance of multi-stage TWT amplifiers: Cascade vs. series," Vacuum Electronics Conference (IVEC), 2011 IEEE International , vol., No., pp. 309-310, Feb. 21-24, 2011.
Nguyen, K.; Wright, E.; Jabotinski, V.; Pershing, D.; Ludeking, L.; Horoyski, P.; Roitman, A.; Dobbs, R.; Hyttinen, M.; Berry, D.; Chernin, D.; Burke, A.; Petillo, J.; Calame, J.; Levush, B.; Pasour, J.; , "15.4: Design of terahertz Extended Interaction Klystrons," Vacuum Electronics Conference (IVEC), 2010 IEEE International , vol., No., pp. 327-328, May 18-20, 2010.
Hyttinen, M.; Roitman, A.; Horoyski, P.; Dobbs, R.; Sokol, E.; Berry, D.; Steer, B.; , "A compact, high power, sub-millimeter-wave Extended Interaction Klystron," Vacuum Electronics Conference, 2008. IVEC 2008. IEEE International , vol., No., pp. 297, Apr. 22-24, 2008.
Booske, J.H.; Dobbs, R.J.; Joye, C.D.; Kory, C.L.; Neil, G.R.; Gun-Sik Park; Jaehun Park; Temkin, R.J.; , "Vacuum Electronic High Power Terahertz Sources," Terahertz Science and Technology, IEEE Transactions on , vol. 1, No. 1, pp. 54-75, Sep. 2011.
Joye C.D.; Calame J.P.; Garven M.; Levush B.; "UV-LIGA microfabrication of 220 GHz sheet beam amplifier gratings with SU-8 photoresist," J. Micromech. Microeng. 20, 125016, 2010.
Young-Min Shin; Barnett, L.R.; Luhmann, N.C.; , "MEMS-fabricated micro vacuum electron devices (μVEDs) for terahertz (THz) applications," Infrared, Millimeter and Terahertz Waves, 2008, IRMMW-THz 2008. 33rd International Conference, vol., No., pp. 1-3, Sep. 15-19, 2008.
Joye, C.D.; Calame, J.P.; Nguyen, K.T.; Pershing, D.; Larsen, P.B.; Garven, M.; Doewon Park; Bass, R.; Levush, B.; , "Microfabrication of wideband distributed beam amplifiers at 220 GHz," Vacuum Electronics Conference (IVEC), 2011 IEEE International , vol., No., pp. 343-344, Feb. 21-24, 2011.
Khanh Nguyen; Ludeking, L.; Pasour, J.; Pershing, D.; Wright, E.; Abe, D.K.; Levush, B.; , "1.4: Design of a high-gain wideband high-power 220-GHz multiple-beam serpentine TWT," Vacuum Electronics Conference (IVEC), 2010 IEEE International , vol., No., pp. 23-24, May 18-20, 2010.
Ling Z.G., Lian K., Jian L.; "Improving patterning quality of SU-8 microstructures by optimizing exposure parameters," Proc. SPIE 3999 , Advances in Resist Technology and Processing XVII, 1019-1027, Jun. 23, 2000.
Del Campo, A., Greiner, C.; "SU-8: a photoresist for high-aspect-ratio and 3D photolithography," J. Micromech. Microeng., 17, R81-95, 2007.
R. Engelke, G. Engelmann, G. Gruetzner, M. Heinrich, M. Kubenz, H. Mischke; "Complete 3D UV microfabrication technology on strongly sloping topography substrates using epoxy photoresist SU-8," J. Microelectronic Engr. 73/74, 456-462, Jun. 2004.
Paul M. Dentinger, W. Miles Clift, Steven H. Goods; "Removal of SU-8 photoresist for thick film applications," J. Microelectronic Eng., vol. 61/62, pp. 993-1000, Jul. 2002.
Srivastava, A.; So, J.K.; Sattorov, M.A.; Kwon, O.J.; Park, G.S.; Baik, C.W.; Kim, J.H.; Chang, S.S.; , "100GHz LIGA-fabricated coupled-cavity device," Vacuum Electronics Conference, 2009. IVEC '09. IEEE International , vol., No., pp. 102-103, Apr. 28-30, 2009.
Pasour, J.; Nguyen, K.; Wright, E.; Balkcum, A.; Atkinson, J.; Cusick, M.; Levush, B.; , "Demonstration of a 100-kW Solenoidally Focused Sheet Electron Beam for Millimeter-Wave Amplifiers," Electron Devices, IEEE Transactions on , vol. 58, No. 6, pp. 1792-1797, Jun. 2011.
Larsen, P.B.; Abe, D.K.; Cooke, S.J.; Levush, B.; Antonsen, T.M.; Myers, R.E.; , "Characterization of a Ka-band Sheet-Beam Coupled-Cavity Slow-Wave Structure," Plasma Science, IEEE Transactions on , vol. 38, No. 6, pp. 1244-1254, Jun. 2010.
Lee, C.-Y.; Chang, C.-L.; Wang, Y.-N.; Fu, L.-M. Microfluidic Mixing: A Review. Int. J. Mol. Sci. 2011, 12, 3263-3287.
Niu X., Lee Y.K., "Efficient spatial-temporal chaotic mixing in microchannels." J. Micromech. Microeng, vol. 13, 454-62, 2003.
De Boer, M.J.; Tjerkstra, R.W.; Berenschot, J.W.; Jansen, H.V.; Burger, G.J.; Gardeniers, J.G.E.; Elwenspoek, M.; van den Berg, A.; , "Micromachining of buried micro channels in silicon," Journal of Microelectromechanical Systems, vol. 9, No. 1, pp. 94-103, Mar. 2000.
Joye, C.D.; Calame, J.P.; Abe, D.K.; Nguyen, K.T.; Wright, E.L.; Pershing, D.E.; Garven, M.; Levush, B.; , "3D UV-LIGA microfabricated circuits for a wideband 50W G-band serpentine waveguide amplifier," Infrared, Millimeter and Terahertz Waves (IRMMW-THz), 2011 36th International Conference on , vol., No., pp. 1-3, Oct. 2-7, 2011.
Dobbs, R.; Roitman, A.; Horoyski, P.; Hyttinen, M.; Sweeney, D.; Chernin, D.; Blank, M.; Barker, N.S.; Booske, J.; Wright, E.; Calame, J.; Makarova, O.V.; , "9.2: Fabrication techniques for a THz EIK," Vacuum Electronics Conference (IVEC), 2010 IEEE International , vol. 18-20, pp. 181-182, May 2010.
International Search Report and Written Opinion of the International Searching Party for PCT/US12/029162 dated Jun. 20, 2012.
Chomnawan, N. and Lee, J-B, On-Chip 3D Air Core Micro-Inductor for High Frequency Applications Using Deformation of Sacrificial Polymer; Proc. SPIE 4334, Smart Structures and Materials 2001: Smart Electronics and MEMS, (Aug. 16, 2001).
Extended European Search Report dated Mar. 30, 2015 for EP Application No. 12768439.7 (PCT/US2012/029162).

* cited by examiner

MICROFABRICATION OF TUNNELS

CROSS-REFERENCE TO RELATED APPLICATIONS

The application claims priority to U.S. Provisional Patent Application entitled, "Microfabrication of Tunnels in Metal for Electron Beams Using Photolithography," filed on Apr. 5, 2011, and assigned U.S. application Ser. No. 61/471,828; the entire contents of which are hereby incorporated by reference.

FIELD OF THE INVENTION

The invention relates to forming hollow bores. More specifically, the invention relates to a method for forming any number of very small, precise high-aspect-ratio hollow bores, or "beam tunnels," of arbitrary cross sectional shape and arbitrarily long length in metals for the purpose of transporting electron beams.

BACKGROUND

Vacuum electron devices that generate electromagnetic power in the gigahertz (GHz=$10^9$ Hz) to terahertz (THz=$10^{12}$ Hz) frequency range often rely on very small metal structures, known as "interaction circuits," that support electromagnetic fields which interact with a beam of electrons in vacuum. Typically, the electrons are guided substantially by an external magnetic field through the interaction circuit(s) without physically touching the walls of the circuit by means of a tunnel, or "beam tunnel," bored through the interaction circuit. The interaction circuit is often substantially metal, such as copper for low microwave loss and high thermal conductivity, or a metal-coated material such as silicon or diamond. At high electromagnetic frequencies, such as above 100 GHz, these beam tunnels become very small, approximately 0.002 inches to 0.050 inches in diameter for a round beam tunnel, and typically 0.1 inch to 5 inches in length.

Traditional methods for forming the beam tunnels through the interaction circuits include (a) drilling round holes, (b) ablating holes by sinker electrical discharge machining (SEDM), (c) forming the beam tunnel from two halves of the cross section by Wire EDM (WEDM) and then bonding the two halves together by brazing, mechanical fixturing, diffusion bonding or other means, (d) laser drilling the holes, (e) ablating holes by water jet, (f) casting the metal into a mold, (g) multi-layer lithography, electroforming and molding (LIGA) processes. However, these methods are all limited in their ability to reliably and precisely form very small holes of arbitrary shape for long lengths. Specific limitations of each of these methods are discussed below.

In the (a) drilling round holes methods, drilling a beam tunnel typically limits the cross sectional shape to round, and has a limited depth that the bore can be drilled to accurately. Furthermore, during drilling, there is a tendency to walk off-center, and the method relies on extremely fragile microdrill bits. In the (b) SEDM method, as practiced in industry, there is typically a very limited beam tunnel length that can be fabricated (i.e., approximately 0.3 inches in length with a 0.005 inch diameter hole (aspect ratio 60:1) at the time of this application). Additionally, SEDM also tends to form a conical rather than cylindrical beam tunnel. The (c) WEDM method typically requires either a pilot hole to be drilled, which can be limited by the drilling techniques described in (a), or the method requires that two halves be bonded or brazed together. In brazing, stresses due to cyclical heating typically tend to separate the two halves where they were joined, which can reduce reliability. The (d) laser ablation method is typically limited in the depth of the cut.

The (e) water-jetting method typically produces a cone-shaped hole rather than a cylindrical one due to ballistic scattering. In the (f) casting method, molten metal around a mold requires the forms to be subjected to high temperatures, which can introduce issues of thermal expansion, can complicate the removal of the molds, and typically has a tendency to leave gaps and voids in the casting. In the case of some pure metals such as copper, cast melting tends to form large crystal grains, which are typically unable to fill the smallest features properly. Finally, (g) conventional multi-layer LIGA techniques require a minimum of three layers, each requiring a separate exposure step, electroforming step and polishing step, and these techniques are only capable of square or rectangular beam tunnel shapes or approximations to true cylinders.

Accordingly, there remains a need for an alternative method of forming beam tunnels in a metal structure. Preferably, this new method would allow for forming any number of very small, precise high-aspect-ratio hollow bores, or beam tunnels, of arbitrary cross sectional shape and arbitrarily long length in metals during a single photolithographic process along with the electromagnetic interaction circuit. Therefore, the method could circumvent many of the shortcomings of the prior methods along with providing a more efficient process.

SUMMARY OF THE INVENTION

The invention satisfies the above-described and other needs by providing for a method of forming hollow bores by positioning one or more forms, such as fibers or sheets, above a substrate, and applying a photoresist over the substrate embedding the one or more forms.

According to another aspect of the invention, a system for forming hollow bores includes a substrate, one or more forms, such as fibers or sheet, located and secured above the substrate, and a photoresist applied over the substrate to embed the one or more forms.

According to another aspect of the invention, a method can be provided for forming beam tunnels by positioning one or more forms above a substrate, applying a photoresist over the substrate embedding the one or more forms; performing a single exposure LIGA process on the photoresist embedding the one or more forms over the substrate, and removing the one or more forms to leave one or more beam tunnels.

These and other aspects, objects, and features of the present invention will become apparent from the following detailed description of the exemplary embodiments, read in conjunction with, and reference to, the accompanying drawings.

DETAILED DESCRIPTION OF EXEMPLARY EMBODIMENTS

Figure 1:
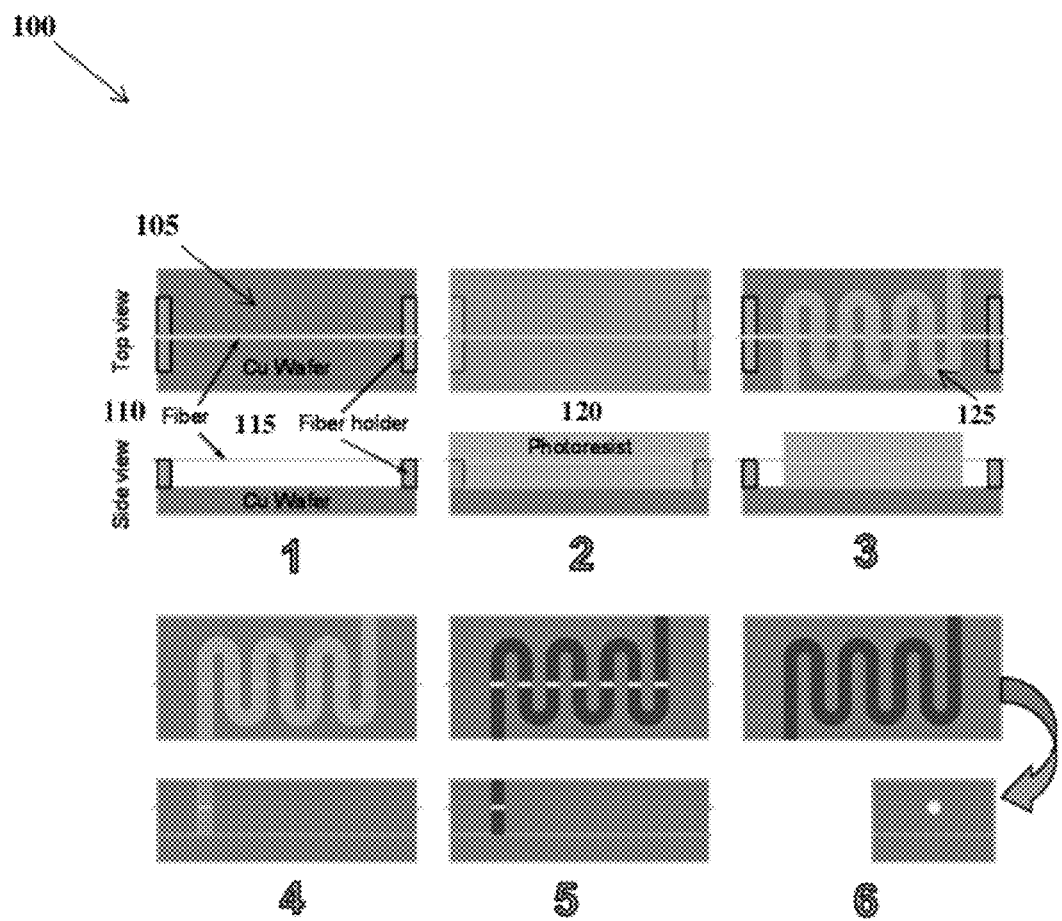
FIG. 1 is a top and side view of the methodology of the invention, in accordance with an exemplary embodiment of the invention.

Referring now to the drawings, in which like numerals represent like elements, aspects of the exemplary embodiments will be described in connection with the drawing set.

In general, this invention is a method to form arbitrarily shaped cross sections of a hollow bore, or beam tunnel, of arbitrary length by means of forms, such as fibers or sheets, stretched over the surface that are substantially transparent to ultraviolet light such that a 3-D mold structure is formed by intersection of these forms with structures formed out of photoresist during an exposure to the ultraviolet light using photolithographic techniques.

FIG. 1 is a top and side view of the methodology of the invention in accordance with an exemplary embodiment of the invention. Specifically, FIG. 1 represents individual steps, illustrated as panels, which will be discussed below. One of ordinary skill in the art will understand that some minor steps, such as cleaning steps, polishing steps, and/or baking on a hot plate have been excluded because they are well known to one of ordinary skill in the art.

In panel 1 of FIG. 1, a form 110, such as a fiber (e.g., monofilament), or array of forms (i.e., more than one fiber, or monofilaments) of a desired size and shape of a final hollow bore, or beam tunnel, can be positioned at a desired height and a desired position above a substrate 105, such as a polished copper wafer. The form(s) 110 can be positioned above the substrate 105 by locating and securing each of the one or more forms 110 with one or more form holders 115. For example, the form holders 115 can include one or more height-setting rods, one or more wire guides, one or more posts, or other accurate means of fixturing.

Each form 110 can be made of a material that can pass the ultraviolet (UV) light used to activate the photoresist in the second step. Specifically, in an exemplary embodiment of the invention, the form 110 can be capable of passing ultraviolet light in the wavelength range of 350-380 nanometers. Furthermore, the form 110 can have other properties that allow it to survive high thermal excursions to approximately 100° C., a sulfuric acid-containing copper plating bath, and strong solvents that can be used to develop the photoresist. Additionally, the form 110 can possess an index of refraction similar to the photoresist to inhibit ultraviolet reflections, and can be removable by some means. A couple of examples of specific form materials that have the necessary characteristics to be suitable for this type of application include Ethylene Tetrafluoroethylene (ETFE), Polyvinylidene Fluoride (PVDF), Polyetherimide (PEI) and Polysulfone. Other form materials can also be utilized, for example, the form can be made from polymer materials, fluoropolymers, glass fibers, plastics, metals, photoresists, or other suitable materials.

In panel 2 of FIG. 1, a photoresist 120 can be applied over the surface of the substrate 105 thus embedding, or completely covering, the form(s) 110 in photoresist 120. Subsequently, ultraviolet photolithography can be performed by means of a mask (not pictured) placed between a collimated ultraviolet source (not pictured) and the substrate 105 being processed. One of ordinary skill in the art will understand that ultraviolet photolithography is a common method used for manufacture of integrated circuits, micro-electro-mechanical systems (MEMS), and microfluidic systems.

In an exemplary embodiment, the mask can be a glass plate that transmits ultraviolet, being coated with a chrome film with the desired lithographic patterns etched into the chrome in order to shadow out areas of the photoresist from ultraviolet exposure. The ultraviolet source is preferably a collimated beam covering the whole area where the pattern is desired to be created. The ultraviolet exposure can also be achieved by other means, such as direct writing of the patterns into photoresist by a laser, or other focused ultraviolet light source. Sources other than ultraviolet, such as X-rays, can also be used. The photoresist can be an epoxy-based material that can undergo chemical reaction upon exposure to ultraviolet light, initiating a crosslinking reaction that can be strengthened by a baking step.

In an exemplary embodiment of the invention, SU-8 can be used as the photoresist 120. In the case of SU-8, a negative photoresist, the mask can allow ultraviolet rays, such as those in the 350-380 nanometer range, to penetrate where one intends photoresist 120 to be hardened by crosslinking the molecular chains of SU-8. In an alternative exemplary embodiment, this described process can be equally achieved with positive-type photoresists 120 as well. Other types of photoresists 120 can also be utilized. For example, photoresists based on chemistries including but not limited to polymethyl methacrylate (PMMA), polymethyl glutarimide (PMGI), polyhydroxystyrene-based polymers, phenol formaldehyde resins such as diazonaphthoquinone (DNQ) or Novolac, or epoxy-based resins such as the previously discussed SU-8.

Following the ultraviolet exposure step, the substrate 105 can be baked to complete the crosslinking reaction in the SU-8 that was exposed to ultraviolet light. The un-crosslinked, or un-hardened, SU-8 photoresist 120 can be removed, or developed off by a solvent. In an exemplary embodiment of the invention, the developing solvent can be Propylene Glycol Methyl Ether Acetate (PGMEA). Other developing solvents or methods can also be utilized, leaving behind a crosslinked, hardened SU-8 structure on the copper substrate 105.

In panel 3 of FIG. 1, after the solvent and un-crosslinked photoresist are removed, the remaining hardened SU-8 and the form(s) 110, combined, can form a 3-D mold 125. The crosslinked SU-8 portion can hold the shape for an electromagnetic interaction circuit, and the form(s) 110 can hold the shape of the electron beam tunnel(s).

In panel 4 of FIG. 1, the substrate 105 can be chemo-electrically plated with copper to fill the volume around the 3-D mold structure comprised of the combined SU-8 and form(s) 110. Thus, the combination of the SU-8 mold and form(s) 110 can enable a true 3-D implementation of a lithography, electroforming, and molding process (as described in relation to panels 2, 3, and 4 of FIG. 1), which is collectively known to one of ordinary skill in the art by the German acronym LIGA, with as few as a single ultraviolet exposure step for efficiency. The single exposure LIGA process incorporates the one or more forms over the substrate having been embedded in the photoresist.

One of ordinary skill in the art will understand that the described techniques are not limited to only copper substrates 105 and copper electroforming. For example, one of ordinary skill in the art could seek to apply it to any number of substrate materials including, but not limited to, aluminum, silicon, germanium, titanium, glass, nickel, silver, gold, or any combination thereof.

In an exemplary embodiment, the electroformed metal can be overplated beyond the extent of the SU-8. Overplating and then grinding or polishing down the excess metal to the desired thickness can ensure a flat surface free of voids or other defects caused by possible non-uniform plating.

In panel 5 of FIG. 1, the crosslinked, or hardened, SU-8 photoresist that remains can be removed by a chemical, thermal, chemo-thermal, or plasma method. Other methods can also be utilized to remove the hardened photoresist.

In panel 6, the form(s) 110 can be removed. For example, the form(s) 110 can be removed by the same chemical, thermal, chemo-thermal, or plasma method utilized above. Additionally, the form(s) 110 can be removed by heating to high temperatures, by dissolution with other chemicals, by mechanical pulling or destruction, by laser ablation, or exposure to X-rays. Other methods can also be utilized. In an exemplary embodiment of the invention, molten salts have been found effective at removing both SU-8 and fiber forms made from Ethylene tetrafluoroethylene (ETFE) or Polyvinylidene fluoride (PVDF).

In an alternative exemplary embodiment, some fiber forms, such as ETFE, can be easily removed from the electroformed structure created in panel 4 prior to the removal of the hardened photoresist in panel 5. For some materials, merely pulling the forms out with little force, such as by hand, is possible.

Finally, to complete the interaction circuit with an integrated beam tunnel, a top cover can be affixed by brazing, mechanical fixturing, diffusion bonding, or other means. One of ordinary skill in the art will understand that this technique can be applied to not only a single form, but also an array of forms constituting a multiple-beam distributed electron beam tunnel.

Figure 2:
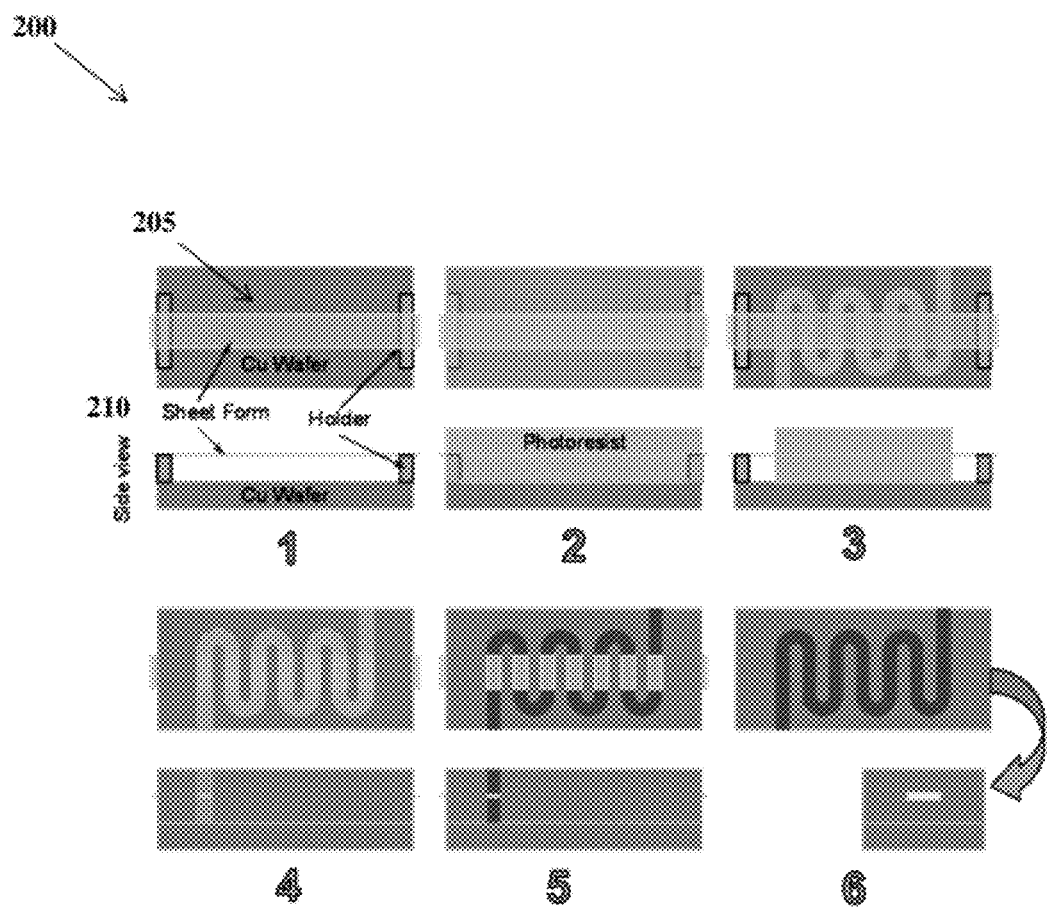
FIG. 2 is a top and side view of the methodology of the invention, in accordance with an alternative exemplary embodiment of the invention.

FIG. 2 is a top and side view of the methodology of the invention, in accordance with an alternative exemplary embodiment of the invention. Specifically, FIG. 2 represents individual steps, illustrated as panels, which follows the same sequence of steps as described in FIG. 1. However, instead of fiber forms(s) 110, FIG. 2 depicts a sheet-like form 210 with a rectangular cross section. The sheet-like form 210 can form a rectangular beam tunnel in the substrate 205 instead of a round fiber 110 that forms a round beam tunnel as represented in FIG. 1. One of ordinary skill in the art will understand that multiple rectangular beams formed by multiple sheet-like forms 210 are possible in this figure.

Figure 3:
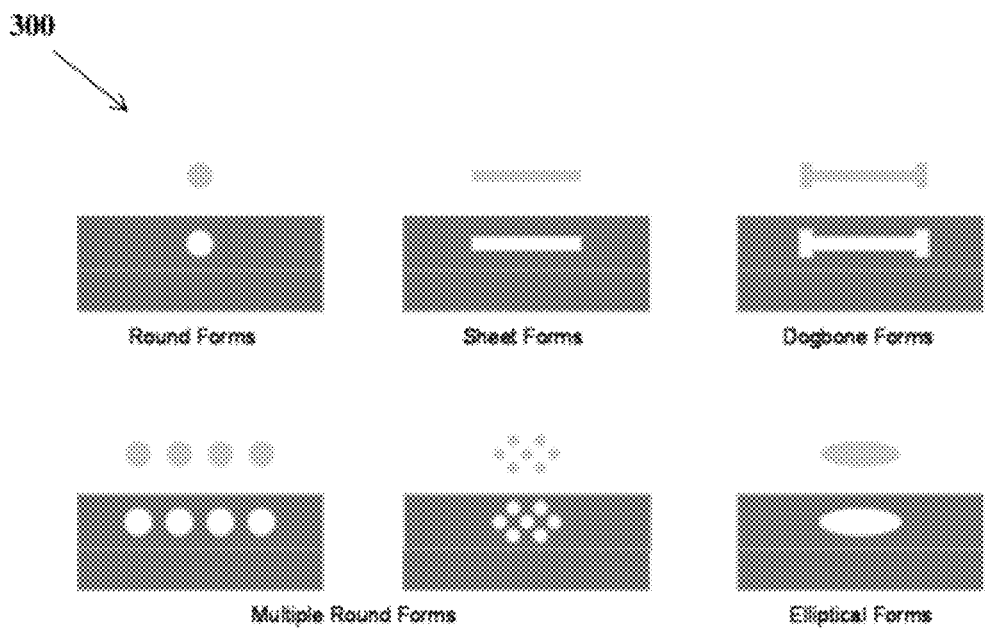
FIG. 3 illustrates potential cross sectional shapes for the forms and beam tunnels that can be fabricated in accordance with an exemplary embodiment of the invention.

FIG. 3 illustrates potential cross sectional shapes for the forms and beam tunnels that can be fabricated from fibers and sheets in accordance with an exemplary embodiment of the invention. The potential cross sectional shapes can include a round beam, such as from a fiber, sheet (rectangular) beam, elliptical beam, dogbone beam tunnel to mitigate the effects of the diocotron instability on an electron beam, and multiple beams (i.e., distributed electron beam). Other shapes can also be fabricated. In addition to shapes, the size of the forms, and therefore, the size of the beam tunnels, may vary. One of ordinary skill in the art will recognize that determining the size, or thickness, of the fibers and sheets that are utilized can depend on ensuring that the material can pass the ultraviolet light used to activate the photoresist.

Figure 4:
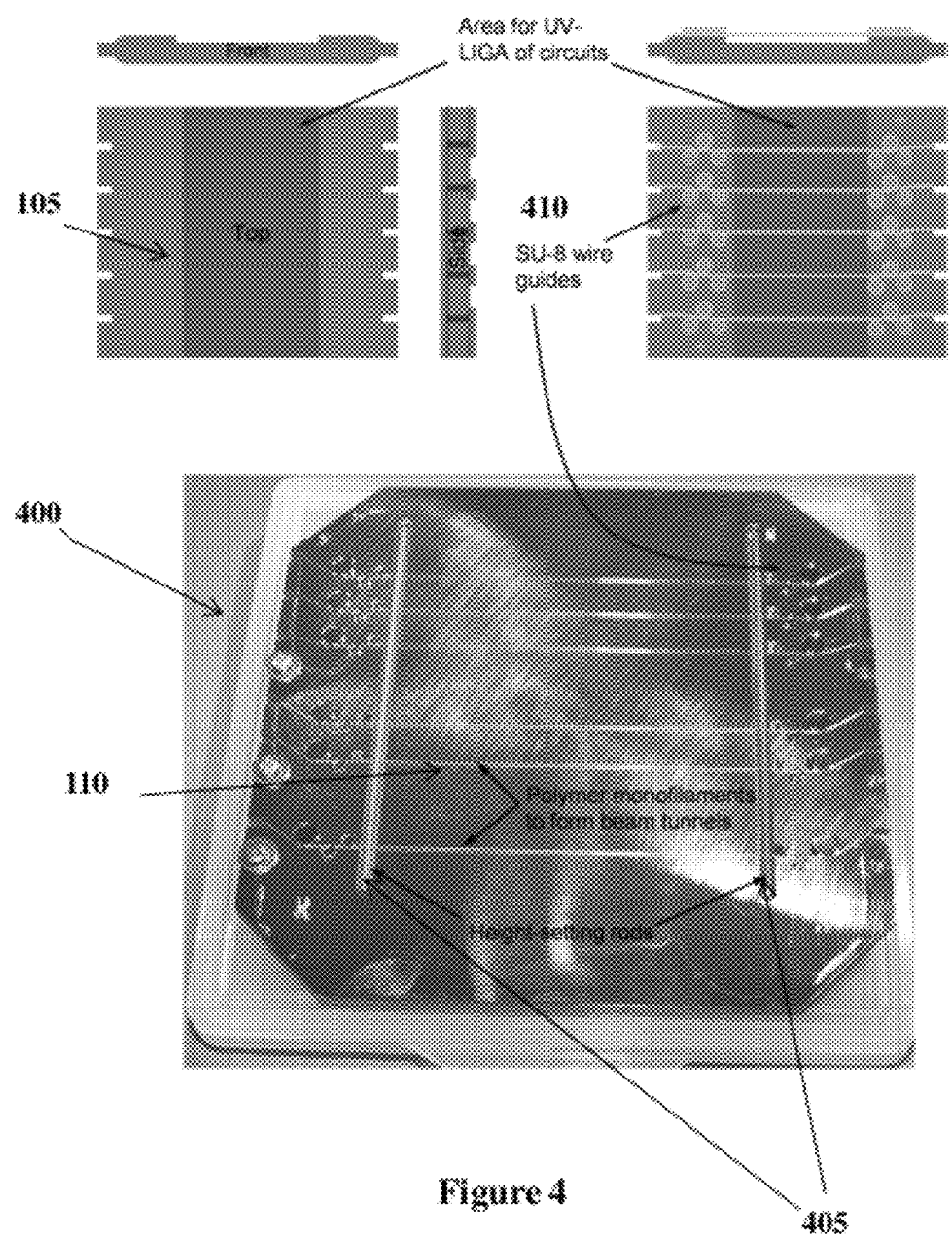
FIG. 4 illustrates a technique to position and secure fibers above a substrate in accordance with an exemplary embodiment of the invention.

FIG. 4 illustrates a technique to position and secure forms 110 above a substrate in accordance with an exemplary embodiment of the invention. As noted previously, each of the one or more forms 110 can be positioned at a desired height and desired position above the substrate 105. For example, the desired height can be set by placing the forms 110 over one or more height-setting rods 405. Furthermore, the one or more height setting rods 405 can have notches, or slots, to secure and precisely position the forms 110 into place.

In an alternative embodiment, again one or more height-setting rods 405 can be utilized to set the desired height of the forms 110. However, in this instance, the forms 110 can be secured and precisely positioned by placing them into one or more wire guides 410. In an exemplary embodiment of the invention, the wire guides 410 can be formed from photoresist using a mask. Additionally, the forms 110 can be tensioned slightly by the wire guides 410 over which the forms 110 can be stretched in various ways to control tension.

In FIG. 4, the image 400 presents an example when the forms 110 have been positioned within +/−0.00016 (16/100,000) inches in height and +/−0.00008 (8/100,000) inches laterally with respect to each other. The precise positioning of the forms 110 subsequently allows precise multiple beam tunnels to be formed utilizing the steps described herein.

Other methods can be utilized to position and secure the forms 110 above the substrate 105. In another example, the forms 110 can be positioned and secured by attaching them to one or more posts.

One of ordinary skill in the art will recognize that the system and methods have applicability to vacuum electron devices that require electron beams to be transported through hollow channels that pass through an electromagnetic slow-wave circuit. Specifically, these electron hollow channels, or beam tunnels, are shrinking toward sizes smaller than traditional techniques can manage as the operating frequencies push toward the THz. However, one of ordinary skill in the art will also recognize that other uses are relevant. For example, the system and method are relevant to microfluidic devices and other applications that require very small channels with aspect ratios of several hundred or more. The system and method are also relevant to creating waveguides, directional couplers, power splitters and combiners, filters, antennas, and other passive electromagnetic structures.

It should be understood that the foregoing relates only to illustrative embodiments of the present invention, and that numerous changes may be made therein without departing from the scope and spirit of the invention as defined by the following claims.

The invention claimed is:

1. A method of forming hollow bores, comprising the steps of:
    positioning one or more forms at a desired height above a substrate, wherein the one or more forms comprise a polymer material,
    applying a photoresist over the substrate above and below the one or more forms, thereby embedding the one or more forms;
    exposing the one or more forms and the photoresist to ultraviolet light from a light source, wherein the polymer material is transparent to the ultraviolet light, such that the polymer material allows the ultraviolet light to pass through the one or more forms, wherein the ultraviolet light triggers a chemical reaction in the photoresist above and below the one or more forms, wherein the chemical reaction enables the photoresist to become hardened, and wherein the one or more forms are positioned such that the one or more forms, the photoresist, the substrate, and the light source remain stationary while the one or more forms are exposed to the ultraviolet light; and
    removing the one or more forms to leave one or more hollow bores.

2. The method of claim 1, wherein the one or more forms comprise fibers and sheets.

3. The method of claim 1, wherein each of the one or more forms comprise a desired size and a desired shape to form a final shape and a final size of the one or more hollow bores.

4. The method of claim 3, wherein the desired shape of each of the one or more forms comprise at least one of round, rectangular, square, elliptical, or dog bone.

5. The method of claim 1, wherein the positioning step comprises locating and securing each of the one or more forms at the desired height and a desired position above the substrate.

6. The method of claim 5, wherein the desired height and desired position is set by utilizing one or more form holders.

7. The method of claim 6, wherein the one or more form holders comprise one or more height-setting rods, one or more wire guides, or one or more posts.

8. The method of claim 1, further comprising:
chemo-electrically plating the substrate with a metal to form a three-dimensional molded structure.

9. The method of claim 1, wherein the ultraviolet light passes through the one or more forms and triggers a second chemical reaction in a portion of the photoresist below the one or more forms.

10. The method of claim 1, wherein the polymer material is a fluoropolymer.

11. The method of claim 1, wherein the polymer material is a plastic.

12. The method of claim 1, wherein the polymer material is ethylene tetrafluoroethylene.

13. A method of forming beam tunnels, comprising the steps of:
positioning one or more forms at a desired height above a substrate, wherein the one or more forms comprise a polymer material,
applying a photoresist over the substrate above and below the one or more forms, thereby embedding the one or more forms;
exposing the one or more forms and the photoresist to ultraviolet light, wherein the one or more forms are positioned such that the one or more forms remain stationary while the one or more forms are exposed to the ultraviolet light, and wherein the polymer material is transparent to the ultraviolet light such that the polymer material allows the ultraviolet light to, in a single ultraviolet exposure:
trigger a chemical reaction in a first portion of the photoresist above the one or more forms, wherein the chemical reaction enables the first portion to become hardened,
pass through the one or more forms, and
trigger the chemical reaction in a second portion of the photoresist below the one or more forms that enables the second portion to become hardened; and
removing the one or more forms to leave one or more beam tunnels.

14. The method of claim 13, wherein the polymer material is a fluoropolymer.

15. A method of forming hollow bores, comprising the steps of:
securing a first form to a first form holder and a second form holder, wherein a first height of the first form holder and a second height of the second form holder are configured to position the first form at a desired height above a substrate;
securing a second form to the first form holder and the second form holder such that the first form and the second form are positioned a predetermined distance laterally with respect to each other, and wherein the predetermined distance is configured to allow multiple beam tunnels to be formed;
applying a photoresist to the substrate above and below the first form and the second form, such that the first form and the second form are embedded in the photoresist;
exposing the first form, the second form, and the photoresist to ultraviolet light, wherein the first form and the second form comprise a first polymer material that is transparent to the ultraviolet light such that the first polymer material allows the ultraviolet light to pass through the first form and the second form, wherein the chemical reaction enables the photoresist to become hardened, and wherein the first form, the second form, and the photoresist are positioned such that the first form, the second form, and the photoresist remain stationary while the first form, the second form, and the photoresist are exposed to the ultraviolet light;
plating the substrate with a second material such that a three dimensional mold is formed around the photoresist, the first form, and the second form, wherein the photoresist holds a first shape of an electromagnetic interaction circuit, wherein the first form holds a second shape of a first electron beam tunnel, and wherein the second form holds a third shape of a second electron beam tunnel; and
removing the first form and the second form to leave the hollow bores.

16. The method of claim 15, wherein the first height and the second height are equal.

17. The method of claim 15, wherein the first polymer material is a plastic.

18. The method of claim 15, wherein the wherein the first polymer material is ethylene tetrafluoroethylene.

19. The method of claim 15, wherein the first polymer material is polyvinylidene fluoride.

20. The method of claim 15, wherein the first polymer material is a fluoropolymer.

* * * * *